United States Patent
Chuang et al.

(10) Patent No.: US 8,451,228 B2
(45) Date of Patent: May 28, 2013

(54) ELECTRONIC DEVICE AND INPUT MODULE THEREOF

(75) Inventors: Cheng-Chieh Chuang, Taoyuan County (TW); Hsing-Chiang Huang, Taoyuan County (TW); Yi-Shen Wang, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 825 days.

(21) Appl. No.: 12/275,068

(22) Filed: Nov. 20, 2008

(65) Prior Publication Data

US 2009/0135144 A1  May 28, 2009

(30) Foreign Application Priority Data

Nov. 22, 2007 (TW) .............................. 96144290 A

(51) Int. Cl.
*G06F 3/02* (2006.01)

(52) U.S. Cl.
CPC ....................................... *G06F 3/02* (2013.01)
USPC ............ 345/168; 345/156; 345/157; 345/173

(58) Field of Classification Search
CPC ........................................................ G06F 3/02
USPC .......................... 345/156, 173, 168, 157, 102
See application file for complete search history.

(56) References Cited

U.S. PATENT DOCUMENTS

| | | | | |
|---|---|---|---|---|
| 6,776,546 B2 * | 8/2004 | Kraus et al. | | 400/472 |
| 6,888,536 B2 * | 5/2005 | Westerman et al. | | 345/173 |
| 7,659,885 B2 * | 2/2010 | Kraus et al. | | 345/168 |
| 8,044,920 B2 * | 10/2011 | Liao et al. | | 345/102 |
| 8,125,446 B2 * | 2/2012 | Aramaki | | 345/157 |
| 2004/0077373 A1 | 4/2004 | Choi et al. | | |
| 2006/0290676 A1 * | 12/2006 | Harada | | 345/168 |
| 2007/0152982 A1 * | 7/2007 | Kim et al. | | 345/173 |
| 2008/0088596 A1 * | 4/2008 | Prest et al. | | 345/173 |
| 2008/0100587 A1 * | 5/2008 | Sano et al. | | 345/173 |
| 2008/0303782 A1 * | 12/2008 | Grant et al. | | 345/156 |
| 2009/0079699 A1 * | 3/2009 | Sun | | 345/173 |
| 2009/0085884 A1 * | 4/2009 | Hibi | | 345/173 |
| 2010/0259472 A1 * | 10/2010 | Radivojevic et al. | | 345/156 |

FOREIGN PATENT DOCUMENTS

| | | |
|---|---|---|
| CN | 1607798 A | 4/2005 |
| CN | 101064222 A | 10/2007 |
| TW | 200638248 A | 11/2006 |

OTHER PUBLICATIONS

Chinese Office Action dated Jul. 13, 2011 is attached hereto.

* cited by examiner

*Primary Examiner* — Thuy Pardo
(74) *Attorney, Agent, or Firm* — Birch, Stewart, Kolasch & Birch, LLP

(57) ABSTRACT

An input module for an electronic device includes a key and a touch sensing unit. The touch sensing unit includes a substrate, a sensing circuit, and a conductive member protruding from the substrate. The conductive member has a connection portion and a sensing portion. The connection portion is electronically connected to the sensing circuit, and the sensing portion is movable with respect to the substrate and connected to the key for detecting a contact on the key.

17 Claims, 6 Drawing Sheets

ELECTRONIC DEVICE AND INPUT MODULE THEREOF

CROSS REFERENCE TO RELATED APPLICATIONS

This Application claims priority of Taiwan Patent Application No. 96144290, filed on Nov. 22, 2007, the entirety of which is incorporated by reference herein.

BACKGROUND OF THE INVENTION

1. Field of the Invention

The invention relates in general to an input module for an electronic device and in particular to an input module with a touch sensing unit for an electronic device.

2. Description of the Related Art

Referring to FIG. 1A, US patent publication No. US20040077373 A1 discloses a conventional portable radiotelephone 100 comprising a keypad assembly 110 and a display 120. The keypad assembly 110 comprises a plurality of key buttons for data input. Specifically, the keypad assembly 110 can function as a touchpad. As shown by the character "A" in FIG. 1, the user can input characters by handwriting on the keypad assembly 110.

Referring to FIG. 1B, the keypad assembly 110 comprises a circuit board 111, a plurality of metal domes 112 on the circuit board 111, a capacity sensor 113, a keypad rubber 114, and a plurality of bosses 115 and key buttons 116. The capacity sensor 113 connects the keypad rubber 114 and the key buttons 116. The bosses 115 project downward from the key pad rubber 114 to press the metal domes 112. The user can input data by directly pressing the key buttons 116 or handwriting thereon.

Conventionally, the capacity sensor 113 is disposed beneath the key buttons 116 for detecting objects (such as user's fingers) over the keypad assembly 110. To facilitate precise sensitivity and reduce distance between the object and capacity sensor 113, the key buttons 116 are preferably flat and thin. However, since the capacity sensor 113, the keypad rubber 114 and the key buttons 116 are thin and tightly bonded, it is difficult to accomplish click feeling and haptic feedback when pressing the key buttons 116.

BRIEF SUMMARY OF INVENTION

An input module for an electronic device is provided. The input module includes a key and a touch sensing unit. The touch sensing unit includes a substrate, a sensing circuit on the substrate, and a conductive member protruding from the substrate. The conductive member has a connection portion and a sensing portion. The connection portion is electronically connected to the sensing circuit, and the sensing portion is movable with respect to the substrate and connected to the key for detecting a contact on the key.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
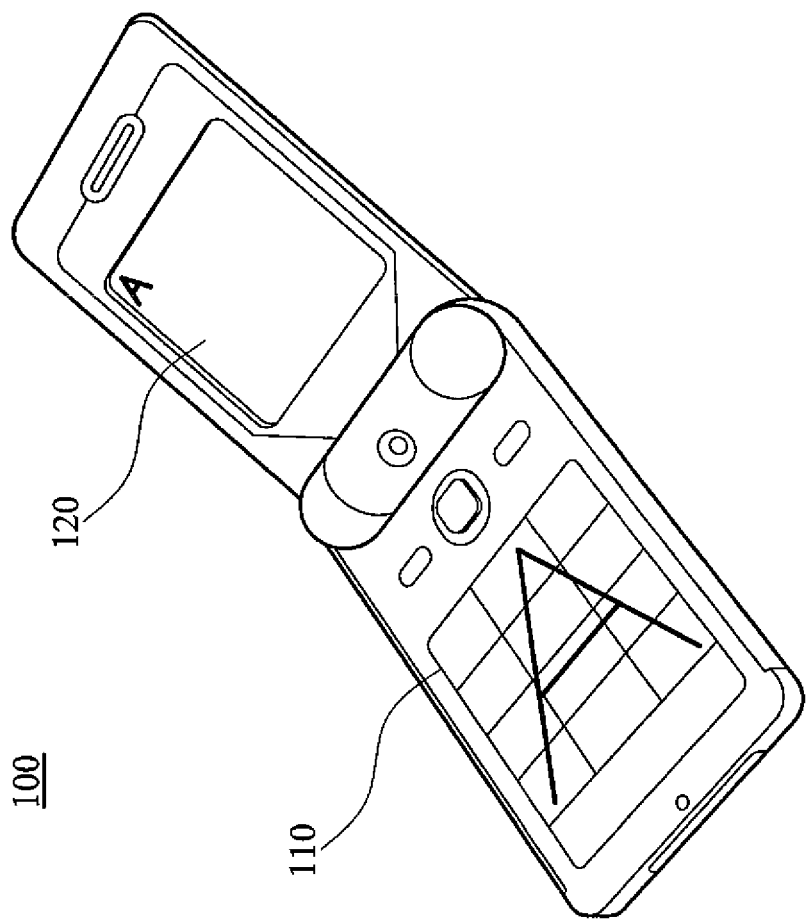
FIG. 1A is a perspective diagram of a conventional mobile phone.
Figure 1B:
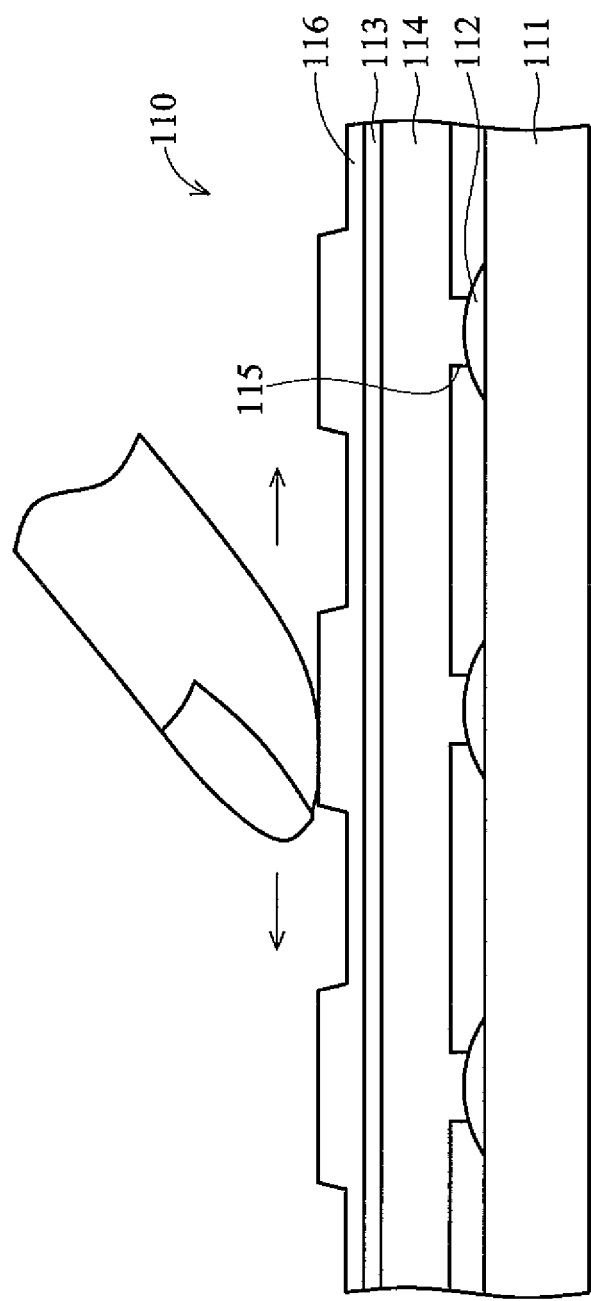
FIG. 1B is a sectional view of the keypad assembly in FIG. 1A.
Figure 2A:
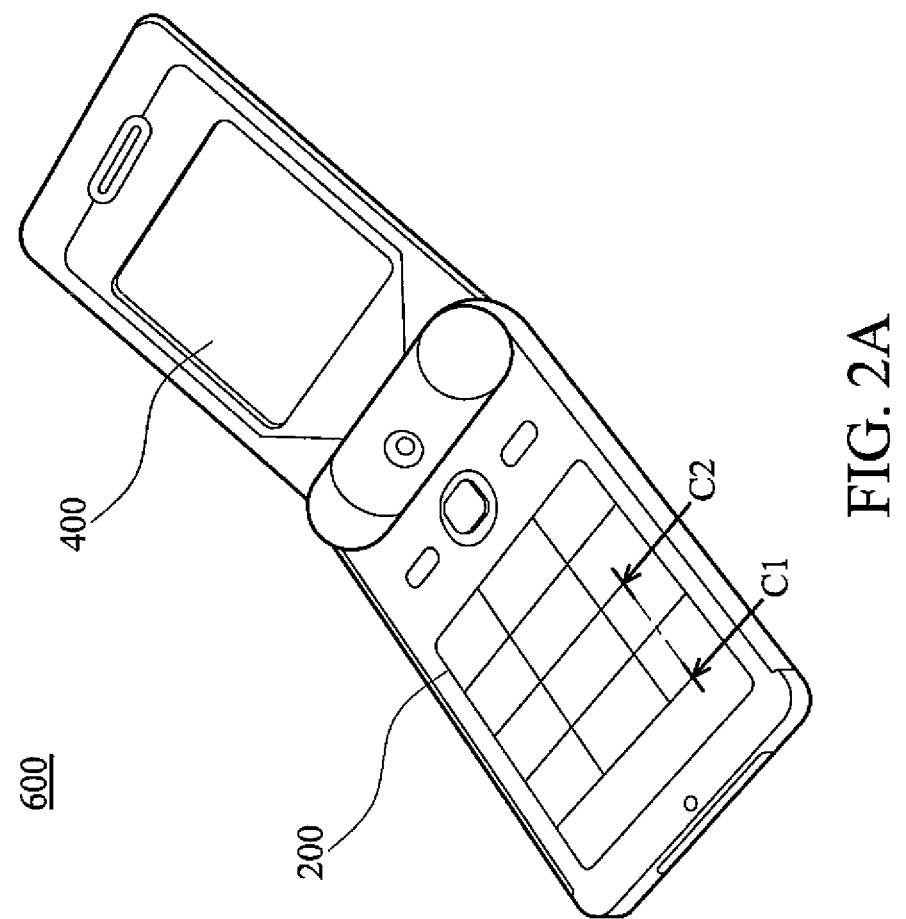
FIG. 2A is a perspective diagram of an embodiment of an electronic device and input module thereof.

Referring to FIG. 2A, an embodiment of an electronic device 600 comprises an input module 200 and a display 400. In this embodiment, the electronic device 600 may be a mobile phone, PDA or smartphone, and the input module 200 may be a dialing keypad. When the user inputs data through the input module 200, the data shows on the display 400.

Figure 2B:
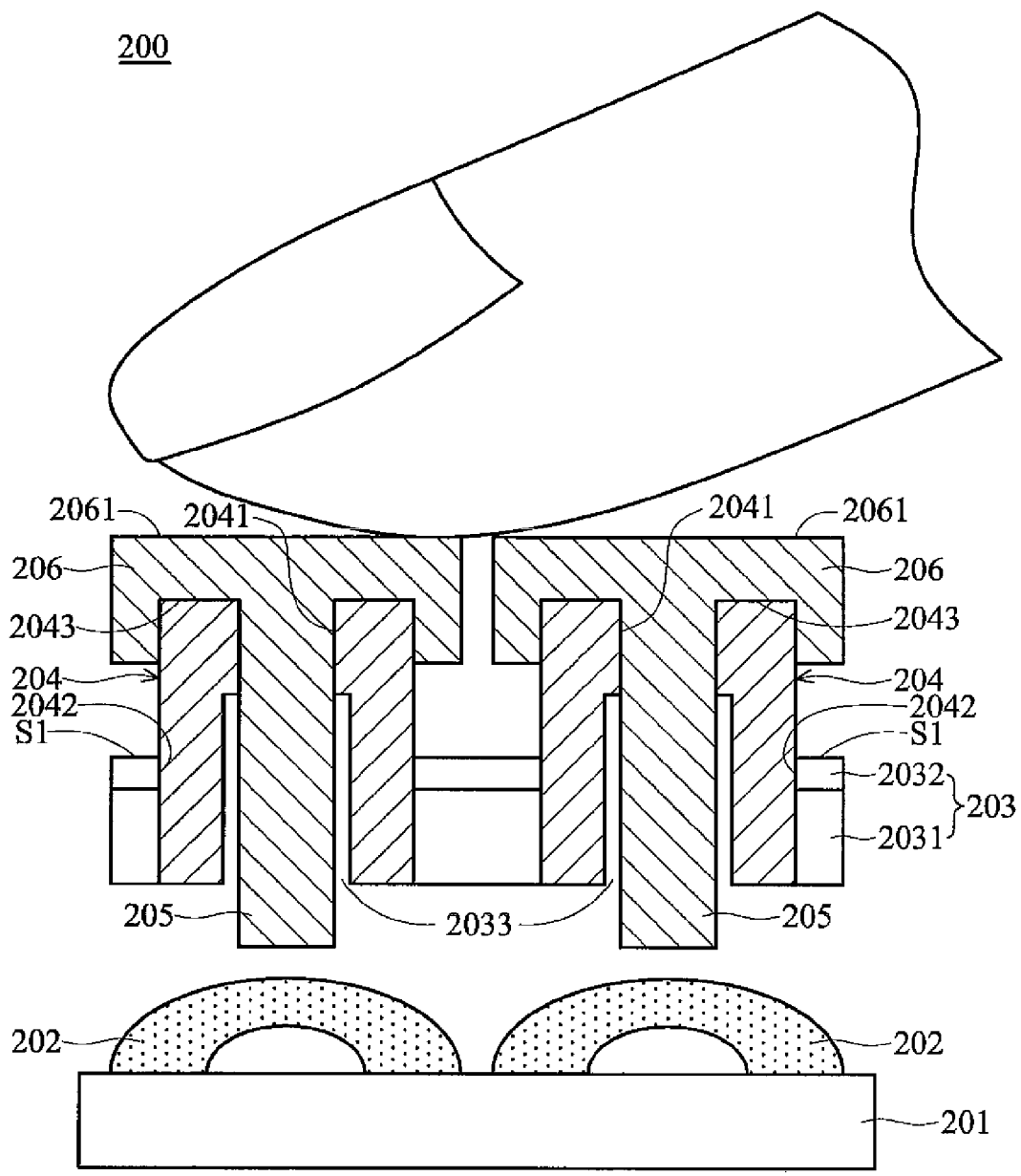
FIG. 2B is a sectional view along C1-C2 in FIG. 2A.

Referring to FIG. 2B, the input module 200 comprises a circuit board 201, a plurality of switches 202, a circuit module 203, a plurality of flexible conductive members 204, contact portions 205, and keys 206. In this embodiment, the circuit module 203 comprises a substrate 2031 and a sensing circuit 2032 electrically connected to the conductive members 204. The circuit module 203 and the conductive members 204 can form a touch sensing unit, such as a capacitive touch sensor, for detecting a touch on a touch control surface 2061 of the key 206.

Each of the contact portions 205 longitudinally passes through a second opening 2041 of the conductive member 204 and penetrates the circuit module 203 through a first opening 2033. When the key 206 is pressed downward by an external force, the contact portion 205 presses and turns on the switch 202 on the circuit board 201 for data input. In some embodiments, the switch 202 may be a metal dome switch or tactile switch, and the contact portion 205 and the key 206 may be integrally formed in one piece.

As shown in FIG. 2B, the flexible conductive member 204 protrudes upward from the substrate 2031, wherein a connection portion 2042 of the conductive member 204 is electrically connected to the sensing circuit 2032. Furthermore, a sensing portion 2043 of the conductive member 204 is connected to the bottom of the key 206 and movable with respect to the substrate 2031. In this embodiment, the conductive member 204 is made of flexible conductive rubber, such as silicon rubber. In some embodiments, the conductive member 204 may be formed by a molding mixture of conductive material and polymer, such as conductive powder and rubber/plastic material. With the conductive member 204 protruding upward from the substrate 2031, precise sensitivity for objects on the surface 2061 of the key 206 is accomplished whereby enabling both data input and touch control on the key 206 of the input module 200.

In this embodiment, as each of the conductive members 204 protrudes from and is higher than the upper surface S1 of the sensing circuit 2032 and extended toward one of the keys 206, the keys 206 and the circuit module 203 can be spaced a specific distance apart from each other, thereby increasing click stroke distance and improving haptic feedback of each key 206. In this embodiment, when the input module 200 functions as a touchpad, the protruding conductive members 204 can detect objects moving on the surface 2061, and when the input module 200 functions as a keypad and the key 206 is pressed, the conductive member 204 is deformed and impels the contact portion 205 to turn on the switch 202 for data input.

Figure 3:
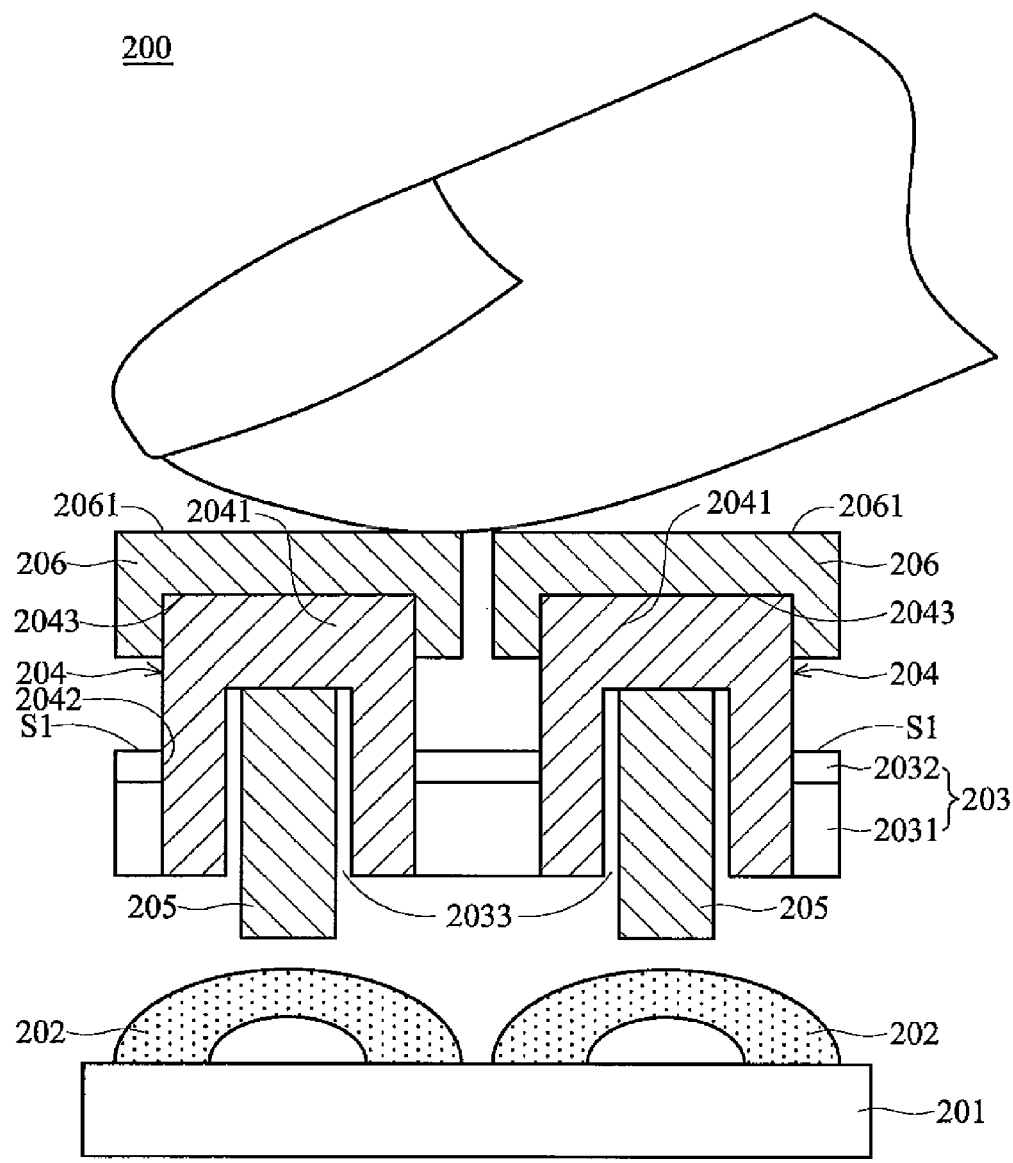
FIG. 3 is a perspective diagram of another embodiment of an input module.

Referring to another embodiment of an input module 200 shown in FIG. 3, the key 206 and contact portion 205 are disposed on opposite sides of the conductive member 204. Here, the cross-section of the conductive member 204 is U-shaped and has no through hole formed thereon. The longitudinal contact portion 205 and the conductive member 204 can be integrally formed in one piece, thus simplifying assembly and saving production cost.

Figure 4:
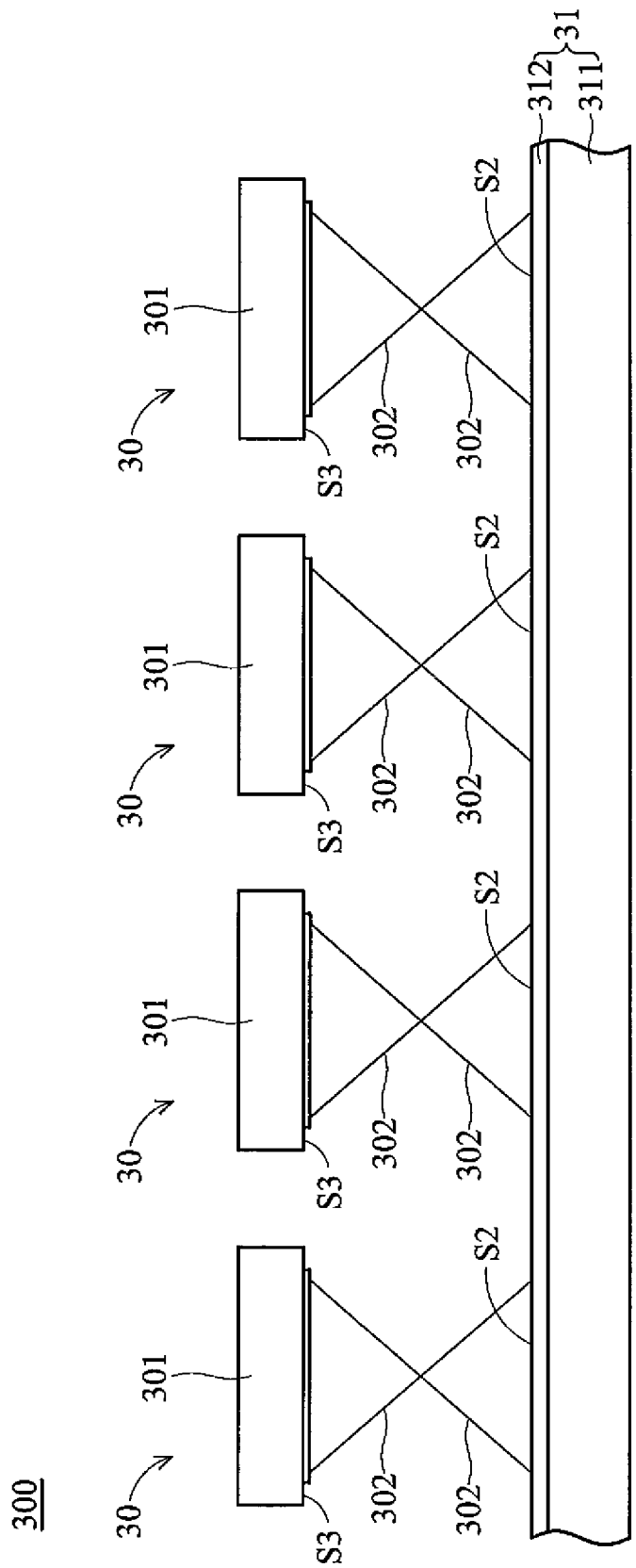
FIG. 4 is a perspective diagram of another embodiment of an input module.

Referring to FIG. 4, another embodiment of an input module 300, such as a QWERTY keyboard of a desktop or laptop PC, includes a circuit module 31 and a plurality of key units 30 disposed thereon. Each of the key units 30 includes a key 301 and a pair of conductive members 302. Each pair of the conductive members 302 forms a scissors-type mechanism pivotally connecting the circuit module 31 and the key 301. In some embodiments, the scissors-type mechanism may comprise only one conductive member 302 and a non-conductive member pivotally connecting the circuit module 31 and the key 301.

As shown in FIG. 4, the circuit module 31 comprises a substrate 311 and a sensing circuit 312, wherein a plurality of switches (not shown) are disposed on the substrate 311 and opposite to the keys 301 respectively. When one of the keys 301 is pressed downward, its opposite switch is turned on for data input. In this embodiment, the circuit module 31 and the conductive members 302 form a touch sensing unit, such as capacitive touch sensor, wherein the conductive members 302 protrude from the sensing circuit 312 and connect to the key 301, and at least one of the conductive members 302 electrically connects the sensing circuit 312. The conductive members 302 may be made of metal or a molding mixture of polymer and conductive material. In some embodiments, the conductive members 302 may be made of a molding mixture of conductive powder and polymer, such as ABS (Acrylonitrile Butadiene Styrene), PC (Polycarbonate) or other polymeric materials.

With the conductive members 302 protruding from the upper surface S2 of the circuit module 31, precise sensitivity of objects above the keys 301 is achieved whereby enabling both data input and touch control on the key 301 of the input module 300. Moreover, since the conductive member 302 protrudes from the circuit module 31 and extends to the bottom surface S3 of the key 301, the key 301 and the circuit module 31 can be spaced a specific distance from each other, thereby increasing click stroke distance and improving haptic feedback of each key 301.

The invention provides an input module for an electronic device capable of functioning as touch pad, handwriting pad or dialing keypad. The user can directly press the keys or slide thereon with fingers for data input or touch control. Specifically, the input module comprises conductive members protruding from the circuit module to the key, increasing click stroke distance and facilitating comfortable usage.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An input module for an electronic device, comprising:
a key, comprising a contact portion;
a touch sensing unit having a substrate, a sensing circuit disposed on the substrate, and a conductive member protruding from the substrate, wherein the conductive member has a connection portion electronically connected to the sensing circuit and a sensing portion movable with respect to the substrate and connected to a bottom surface of the key for detecting a contact on the key, wherein the contact portion of the key passes through the conductive member and penetrates the substrate and the sensing circuit;
a circuit board disposed under the substrate; and
a switch disposed on the circuit board and opposite to the key, wherein when the key is pressed by an external force, the contact portion of the key is configured to contact and turn on the switch.

2. The input module mechanism as claimed in claim 1, wherein the switch is a metal dome switch.

3. The input module as claimed in claim 1, wherein the conductive member comprises conductive rubber.

4. The input module as claimed in claim 1, wherein the cross-section of the conductive member is U-shaped.

5. The input module as claimed in claim 1, wherein the conductive member forms a part of a scissors-type mechanism pivotally connecting the substrate and the key.

6. The input module as claimed in claim 1, wherein the conductive member comprises conductive polymeric material.

7. The input module as claimed in claim 1, wherein the touch sensing unit comprises a capacitive touch sensor.

8. The input module as claimed in claim 1, wherein when the key is pressed by the external force, the sensing portion of the conductive member is configured to move toward the substrate due to a deformation of the conductive member, so as to enable the contact portion of the key to contact and turn on the switch.

9. The input module as claimed in claim 1, wherein the conductive member protrudes upwardly from the substrate and the sensing portion of the conductive member is higher than an upper surface of the sensing circuit.

10. An electronic device, comprising:
a display; and
an input module electrically connected to the display for data input, the input module comprising:
a key, comprising a contact portion;
a touch sensing unit having a substrate, a sensing circuit disposed on the substrate, and a conductive member protruding from the substrate, wherein the conductive member has a connection portion electronically connected to the sensing circuit and a sensing portion movable with respect to the substrate and connected to a bottom surface of the key for detecting a contact on the key, wherein the contact portion of the key passes through the conductive member and penetrates the substrate and the sensing circuit;
a circuit board disposed under the substrate; and
a switch disposed on the circuit board and opposite to the key, wherein when the key is pressed by an external force, the contact portion of the key is configured to contact and turn on the switch.

11. The electronic device as claimed in claim 10, wherein the conductive member comprises conductive polymeric material.

12. The electronic device as claimed in claim 10, wherein the conductive member comprises conductive rubber.

13. The electronic device as claimed in claim 10, wherein the input module comprises a dialing keypad.

14. The electronic device as claimed in claim 10, wherein the input module comprises a QWERTY keyboard.

15. The electronic device as claimed in claim 10, wherein the touch sensing unit comprises a capacitive touch sensor.

16. The electronic device as claimed in claim 10, when the key is pressed by the external force, the sensing portion of the conductive member is configured to move toward the substrate due to a deformation of the conductive member, so as to enable the contact portion of the key to contact and turn on the switch.

17. The electronic device as claimed in claim 10, wherein the conductive member protrudes upwardly from the substrate and the sensing portion of the conductive member is higher than an upper surface of the sensing circuit.

\* \* \* \* \*